US006461169B1

United States Patent
Harrison et al.

(10) Patent No.: US 6,461,169 B1
(45) Date of Patent: Oct. 8, 2002

(54) INTERCONNECTING CIRCUIT MODULES TO A MOTHERBOARD USING AN EDGE CONNECTOR WITH CONDUCTIVE POLYMER CONTACTS

(75) Inventors: Joe A. Harrison, Olympia, WA (US); Tom G. Ruttan, Lake Oswego, OR (US); Mathew C. Miscio, University Place, WA (US)

(73) Assignee: Intel Corporation, Hillsboro, OR (US)

( * ) Notice: Subject to any disclaimer, the term of this patent is extended or adjusted under 35 U.S.C. 154(b) by 0 days.

(21) Appl. No.: 09/849,506

(22) Filed: May 4, 2001

(51) Int. Cl.[7] ............................. H01R 12/00; H05K 1/00
(52) U.S. Cl. ............................. 439/65; 439/55; 439/66
(58) Field of Search ............................. 439/157, 152, 439/153, 154, 155, 156, 158, 159, 160, 65, 951, 954, 66, 55; 174/260; 361/760, 785

(56) References Cited

U.S. PATENT DOCUMENTS

| 2,926,340 A | * | 2/1960 | Blain et al. ............... 365/55 |
| 5,468,995 A | * | 11/1995 | Higgins, III ............ 257/697 |
| 5,478,259 A | * | 12/1995 | Noschese ................ 439/607 |
| 6,115,260 A | | 9/2000 | Nakajima et al. ........ 361/760 |
| 6,137,709 A | | 10/2000 | Boaz et al. ................ 365/51 |

OTHER PUBLICATIONS

Data sheet, *Rambus® RIMM™ Module (with 256/288Mb RDRAMs)*, Copyright Oct. 2000,Rambus Inc, date actually published unknown, pp. 1–12.
Data Sheet, *Rambus® RIMM™ Connector*, Copyright Jul. 1999, Rambus Inc., date actually published unknown, pp. 1–10.

* cited by examiner

*Primary Examiner*—Brian Sircus
*Assistant Examiner*—Chandrika Prasad
(74) *Attorney, Agent, or Firm*—Fish & Richardson, P.C., P.A.

(57) ABSTRACT

An interconnected circuit module and motherboard use an electrical edge connector with conductive polymer contacts. The circuit module has electrical terminals along an edge of a front surface, and the electrical terminals extend to plated cylindrical grooves that are formed in the edge surface of the circuit module. The electrical edge connector is fastened to a surface of the motherboard and receives the edge terminals of the circuit module. When the circuit module is secured in the edge connector, the conductive polymer contacts are aligned with the cylindrical grooves of the circuit module and compressed against a land grid array on the surface of the motherboard. The connector is able to transmit electrical signals between the circuit module and the motherboard without the used of electrical pin connections.

20 Claims, 5 Drawing Sheets

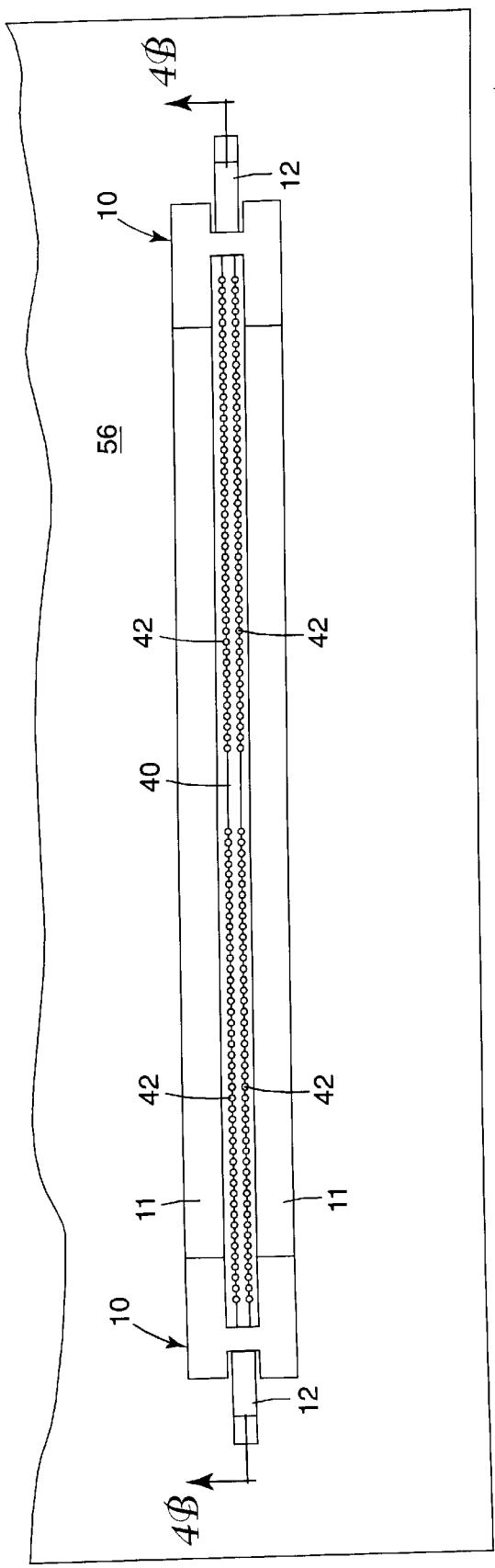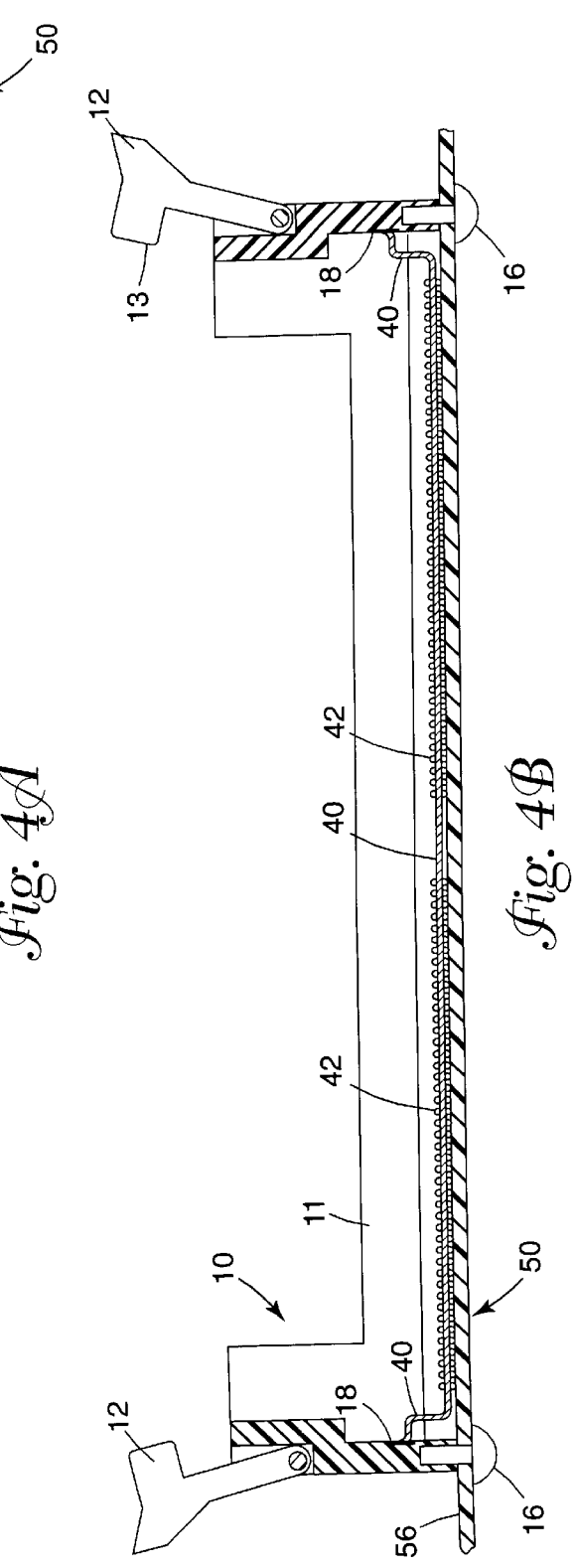

US 6,461,169 B1

INTERCONNECTING CIRCUIT MODULES TO A MOTHERBOARD USING AN EDGE CONNECTOR WITH CONDUCTIVE POLYMER CONTACTS

TECHNICAL FIELD

This invention relates to interconnecting edge-connected circuit modules to a motherboard.

BACKGROUND

Computer systems often use a combination of circuit modules that are interconnected to a computer motherboard. In order to reduce the size of the computer system and increase the number of circuit modules that may be interconnected to the motherboard, electrical edge connectors are used to connect edges of the circuit modules to a surface of the motherboard. The electrical edge connector is fastened to the motherboard and retains the circuit module in a position that is substantially perpendicular to the motherboard, so a plurality of circuit modules extending in a direction perpendicular to the surface of the motherboard may electrically communicate with the motherboard.

Conventionally, the electrical edge connector includes a set of electrically conductive pins that are connected to the motherboard through plated holes. In addition, other types of fasteners, such as screws or rivets, are also used to attach the connector to the motherboard. A circuit module for edge connecting to the motherboard includes a circuit board, a set of electrically conductive terminals along an edge of the circuit board, and integrated circuits mounted to the circuit board. The edge of the circuit module with the electrical terminals is inserted into a female socket of the connector, and a latch coupled to the connector secures the circuit module in the socket. The connector has a set of electrically conductive contacts in the female socket that corresponds to the set of electrical terminals on the edge of the circuit module. When the circuit module is inserted into the female socket of the connector, and the latch secures the circuit module in place, each of the edge terminals of the circuit module touches a corresponding electrical contact in the connector. Each electrical contact in the female socket of the connector follows a conductive path to a corresponding pin of the connector, which is electrically connected to the plated holes of the motherboard.

An example of a circuit module that is edge-connected to a motherboard is a computer memory module. Random Access Memory (RAM) may be added to computer systems using memory modules and memory module socket connectors. Typical forms of a memory module are Single Inline Memory Module (SIMM), Dual Inline Memory Module (DIMM), and Direct Rambus® Memory Module (RIMM™ module).

The assembly process of mounting the memory module socket connectors to the motherboard generally requires a hand-assembly step. Edge connectors of a long length and many pins, such as the 5.5 inch long RIMM™ module socket connector with 184 pins, that need to be inserted into the motherboard are typically placed by hand into the correct location during to the assembly. Afterwards, a wave solder process may be used to secure the pins into the plated holes of the motherboard.

Many components assembled to motherboards in the printed circuit board industry use surface mount pads instead of pins, so the assembly process may be automated. Also, surface mounting the components to the motherboard eliminates the need for soldering the individual pins to the plated holes. Attempts have been made to replace the pins of the RIMM™ connector with surface mount pads and to assemble the connector to surface mount pads on the motherboard. A surface mountable memory module connector could offer advantages including simplified assembly to the motherboard and a reduction in electrical parasitics, such as inductance and resistance. However, the long length of the RIMM™ connector has prevented surface mounting the connector to the motherboard with a high level of reliability. The lack of coplanarity along the entire length of the connector and the motherboard inhibits the reliable surface mounting of the connector to the motherboard.

DESCRIPTION OF DRAWINGS

FIGS. 4A–B are views of the electrical edge connector and the motherboard shown in FIGS. 1, 2, and 3.

Like reference symbols in the various drawings indicate like elements.

DETAILED DESCRIPTION

Figure 1:
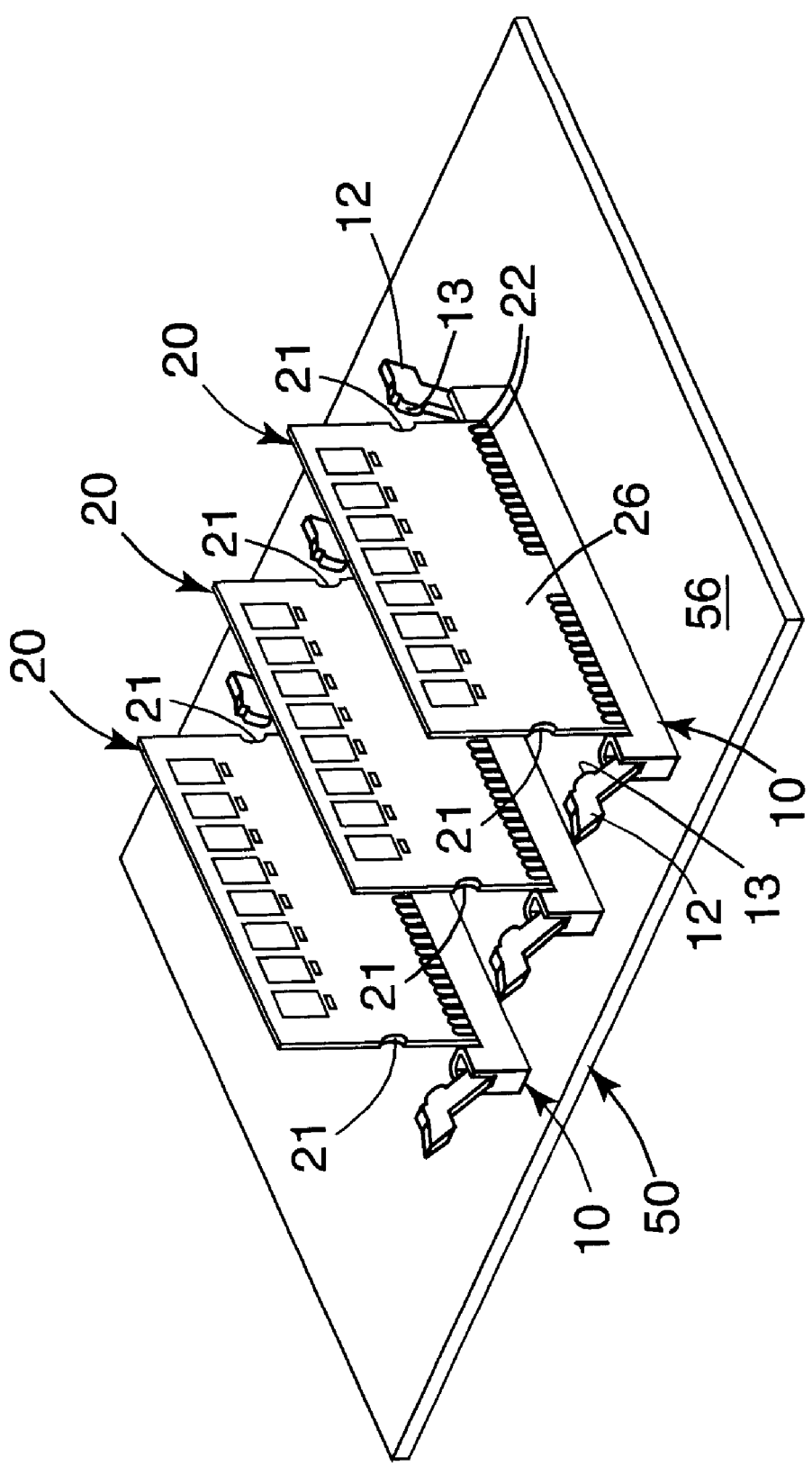
FIG. 1 is a perspective view of three circuit modules connected to a motherboard in accordance with the invention.

A perspective view of a set of circuit modules 20 connected to a motherboard 50 in accordance with the invention is shown in FIG. 1. In this case, the circuit modules 20 are memory modules 20. The memory modules 20 are designed to be replaceable by a user, if the memory module 20 fails or the user wants a memory upgrade. For each memory module 20 there is a separate electrical edge connector 10 secured to a top surface 56 of the motherboard 50. Each of the memory modules 20 fits into one of the electrical edge connectors 10 so that edge terminals 22 on the memory module 20 become electrically connected to corresponding electrical lands (not shown in FIG. 1, and discussed later) on the motherboard 50. The memory modules 20 when inserted into the electrical edge connectors 10 are oriented such that the front surface 26 of each memory module 20 is normal to the top surface 56 of the motherboard 50.

A pair of hinged latches 12 on each connector 10 secures the memory module 50 in the connector 10, as is conventional. The latches 12 are pivoted upward from the unsecured position shown in FIG. 1 to a secured position (not shown in FIG. 1, and discussed later). A protrusion 13 on each latch 12 mates with a pair of notches 21 in opposite sides of each memory module 20 to secure the memory modules 20 in position.

Figure 2:
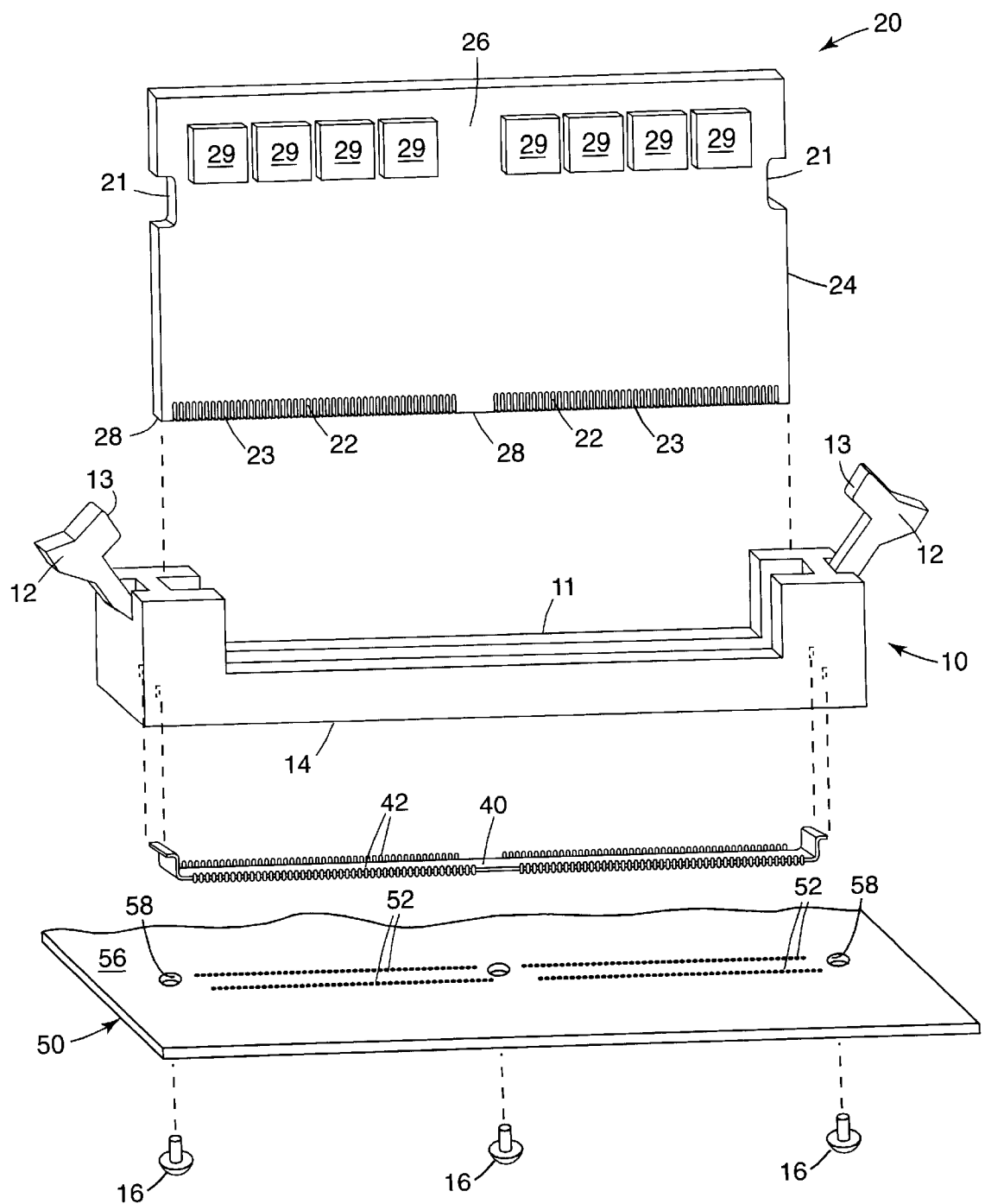
FIG. 2 is an exploded view of a circuit module, an electrical edge connector, and a motherboard shown in FIG. 1.

One of the memory modules 20, a corresponding edge connector 10 (the connector 10 in exploded view), and the motherboard 50 from FIG. 1 are shown in an exploded view in FIG. 2. The memory module 20 includes a rectangular circuit board 24 having a front surface 26 upon which a number of memory chips 29 are mounted. In this embodiment, the electrical terminals 22 are positioned on both the front surface 26 and a back surface (not shown in FIG. 2, and discussed later) of the memory module circuit board 24. The electrical terminals 22 are positioned along an edge surface 28 of the circuit board 24 that is inserted into the connector 10. The memory module circuit board 24 has a set of plated cylindrical grooves 23 in the edge surface 28 of the circuit board 24. Each cylindrical groove 23 corresponds to one of the electrical terminals 22. The grooves 23 are plated with a conductive material, so the electrical terminals 22 extend onto the edge surface 28 of the circuit board 24. In standard configurations, each memory module 20 may have a total of 168 or 184 terminals that are spaced about 1 mm apart from each other, although there could be any number of terminals on each module 20.

The electrical connector 10 is mechanically affixed to the surface 56 of a region of the motherboard 50 that includes electrical lands 52. The connector 10 is affixed to the motherboard 50 using three fasteners 16 (for example, rivets or screws) that extend to the bottom surface 14 of the connector 10 from corresponding holes 58 in the motherboard 50. The connector 10 houses a carrier 40 made of nonconductive material such as Kapton. Attached to the carrier 40 is a set of conductive polymer contacts 42, the number of which corresponds to the number of terminals 22 and electrical lands 52. The conductive polymer contacts 42 may be attached to the carrier 40 using various methods. For example, one method is to mold the conductive polymer contacts 42 into the carrier 40. Another method is to bond the conductive polymer contacts 42 to the carrier 40, and then use a curing process to set the contacts 42. The nonconductive carrier 40 is coupled to an inner surface (not shown in FIG. 2, and discussed later) of the electrical connector 10 so that the carrier 40 is aligned with the edge surface 28 of the memory module 20 when inserted into the connector 10. The conductive polymer contacts 42 are spaced along the carrier 40 so as to align with the plated grooves 23 of the memory module when inserted into the connector 10, as well as the electrical lands 52 on the motherboard 50. Hence, when the memory module 20 is secured into the connector 10, an electrical signal from an electrical terminal 22 may continue to the corresponding plated groove 23 and transmit through the corresponding conductive polymer contact 42 to the corresponding electrical land 52 on the motherboard 50.

Figure 3A:
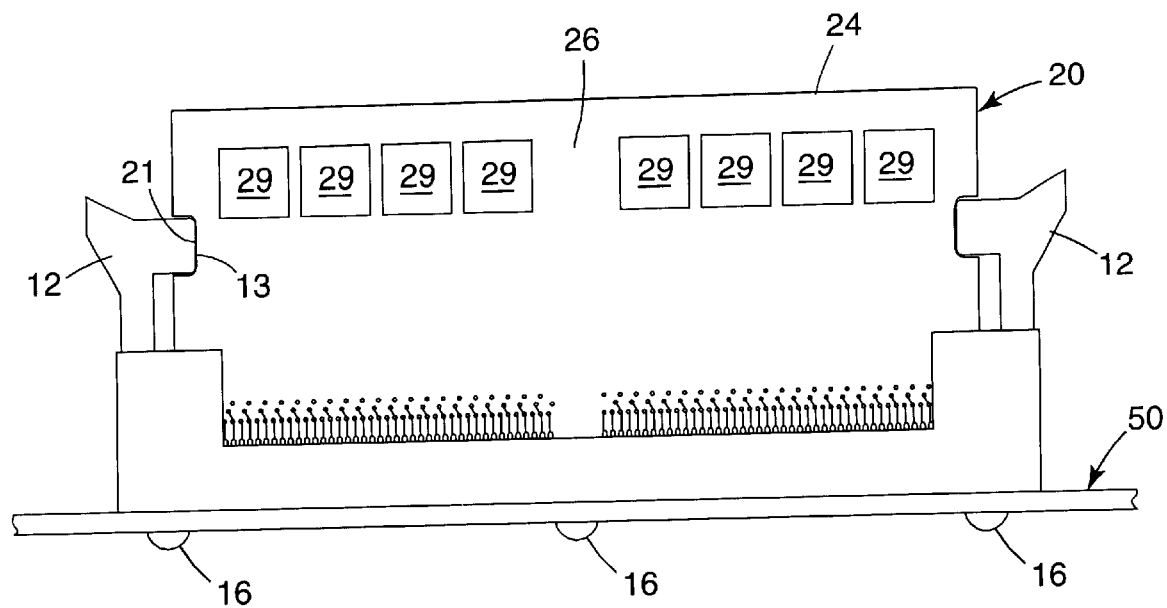
FIGS. 3A–B are views of the embodiment from FIG. 2 showing the circuit module interconnected to the motherboard.
Figure 3B:
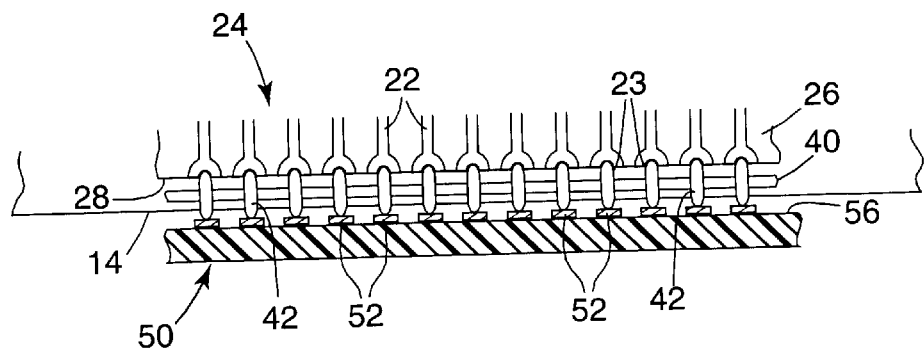

FIG. 3A shows the memory module 20 inserted into the connector 10, which is affixed to the motherboard 50. In this figure, the hinged latches 12 are shown in the position that secures the module 20 into the connector 10. As such, the latches 12 are pivoted toward the module 20 so that the protrusions 13 in the latches 12 fit into the corresponding notches 21 in the memory module 20. FIG. 3B shows a detailed of a portion of the front surface 26 of the circuit board 24, with cross-sections in the plane of the front surface 26 showing the interconnected circuit board 24 and the motherboard 50. Also, FIG. 3B shows how the cylindrical grooves 23 of the memory module 20 mate with the conductive polymer contacts 42. The electrical terminals 22 on the memory module circuit board 24 extend to the edge surface 28 where the terminals 22 meet the cylindrical grooves 23. The cupped-shape of the cylindrical grooves 23 allows each groove 23 to partially surround the corresponding conductive polymer contact 42. Each conductive polymer contact 42 is compressed onto the corresponding electrical land 52 of the motherboard 50 when the memory module 20 is secured in the connector 10 using the latches 12. Thus, an electrical connection is established between the terminals 22 of the memory module 20 and the electrical lands 52 of the motherboard 50.

The interface of the plated grooves 23 of the circuit board 24, the conductive polymer contacts 42 of the connector 10, and the electrical lands 52 of the motherboard 50 minimizes the distance traveled by the electrical current from the plated grooves 23 to the electrical lands 52. Reducing the distance the current must traverse from the memory module circuit board 24 to the electrical lands 52 decreases electrical resistance and inductance between the memory module 20 and the motherboard 50.

FIG. 4A shows a top view of the electrical edge connector 10 affixed to the top surface 56 of the motherboard 50 without the memory module 20 inserted into the connector 10. The carrier 40 and conductive polymer contacts 42 are positioned in the connector housing 11, and are positioned such that when the connector is affixed to the motherboard 50, the conductive polymer contacts 42 align with the electrical lands 52 (shown in FIG. 2) of the motherboard 50.

A cross-sectional view of the electrical edge connector 10 affixed to the motherboard 50 is shown in FIG. 4B. The conductive polymer contacts 42 are coupled to the nonconductive carrier 40, which is attached to inner surfaces 18 of the connector housing 11. The conductive polymer contacts 42 are not bonded to the electrical lands 52, but the contacts 42 correspond to and align with the electrical lands 52 when the connector 10 is affixed to the motherboard 50. Although the top surface 56 of the motherboard 50 may not be entirely planar or the carrier 40 may not be entirely linear, the connector 10 affixed to the motherboard 50 forces the conductive polymer contacts 42 to make contact with the corresponding electrical lands 52. Also, the conductive polymer contacts 42 may further compress onto the electrical lands 52 under the force of an inserted memory module 20 (FIG. 3). Thus, a reliable connection is established between the electrical terminals 22 (FIG. 3) of the memory module 20 and the electrical lands 52 even in environments with vibration. Further, limitations with prior art systems that prevent reliable automated assembly of the connector 10 to the motherboard 50 using solder surface mounting pads (as the electrical lands 52) are overcome.

Figure 5A:
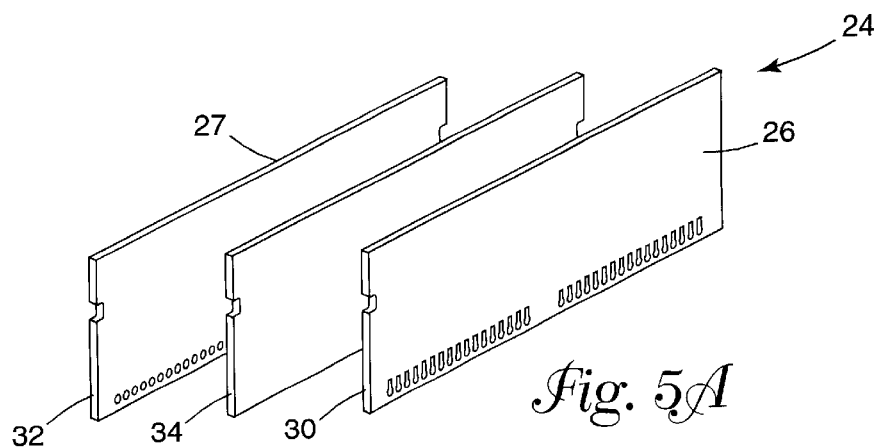
FIGS. 5A–D are perspective views showing the manufacturing of the circuit module shown in FIGS. 1, 2, 3, and 4.
Figure 5B:
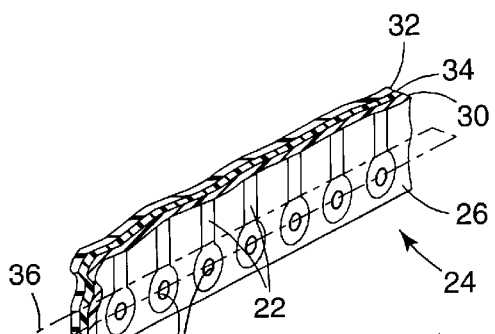

FIGS. 5A–D show perspective views of the memory module circuit board 24 shown in FIGS. 1–4. In this embodiment as shown in the exploded view in FIG. 5A, the memory module 20 comprises a combination of three layers—front layer 30, middle layer 34, and back layer 32. FIG. 5B shows a portion of the circuit board 24 after the three layers (30, 32, and 34) are combined to form the circuit board 24. Holes, known as blind vias 38 are drilled through the front layer 30 and the back layer 32, but the blind vias 38 do not drill through the middle layer 34. Each blind via 38 corresponds to an electrical terminal 22 that is formed on the front surface 26 or back surface 27 of the circuit board 24.

Figure 5C:
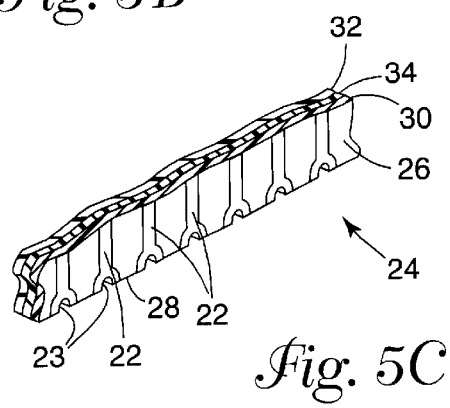
Figure 5D:
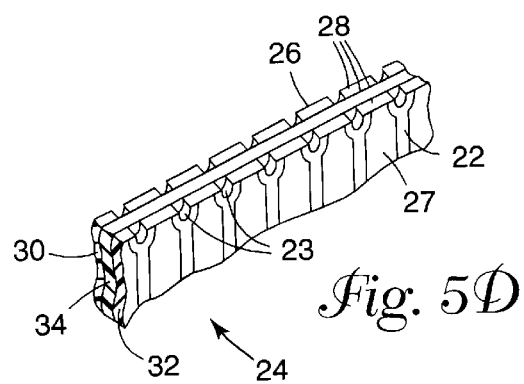

After the electrical terminals 22 on the front surface 26 and the back surface 27 of the memory module circuit board 24 are formed and the blind vias 38 are plated with a conductive material, a portion of the circuit board 24 is removed along a plane 36 that passes through the center of the blind vias 38. FIG. 5C shows a perspective view of the edge surface 28 formed after the portion of the circuit board 24 was removed along the plane 36. Also, FIG. 5C shows the resulting plated cylindrical grooves 23 formed in the edge surface 28 of the circuit board 24. FIG. 5D shows a different perspective view of the plated cylindrical grooves 23 in the edge surface 28 of the circuit board 24. The middle layer 34 separates the grooves 23 of the front layer 30 and the back layer 32 because the blind vias 38, as discussed previously, did not drill through the middle layer 34. The separation of the plated grooves 23 of the front layer 30 and the back layer 32 enables a conductive polymer contact 42 (FIG. 3) to be partially surrounded by the appropriate groove 23 in the memory module circuit board 24.

Interconnecting a circuit module 20 to a motherboard 50 using an electrical edge connector 10 is thus achievable without the need for electrical pin connections as with the prior art. In addition, the process for assembling the connector 10 to the motherboard 50 is simplified compared to prior art methods that require the manual placement of the connector pins into holes of the motherboard 50. Also, the use of conductive polymer contacts 42 in accordance with the invention avoids the soldering process of the prior art to bond the electrical pin connections to the holes of the motherboard 50. Accordingly, the invention may have one or more of the following advantages: a reduction in electrical parasitics between the memory module 20 and the motherboard 50, savings in assembly process cost, and simplified attachment of the connector 10 to the motherboard 50.

A number of embodiments of the invention have been described. Nevertheless, it will be understood that various modifications may be made without departing from the spirit and scope of the invention. For example, the connector 10 may be coupled to the motherboard 50 using a plurality of surface mounting pads instead of the three fasteners 16. Also, the plated grooves 23 in the edge surface 28 of the memory module circuit board 24 may be a shape other than cylindrical depending on the process used to form the grooves 23. Another embodiment of the invention may use electrical terminals 22 only on a single surface 26 or 27 instead of the front and back surfaces 26 and 27. A further embodiment may have the conductive polymer contacts 42 coupled to more than one carrier 40 depending on the configuration of the contacts 42 within the connector housing 11. . Further yet, the invention may use the electrical edge connector 10 to connect a circuit module other than a memory module 20, such as PCI add-in cards, audio modem risers (AMRs), voltage regulator modules, or DC-DC converters. Accordingly, other embodiments are within the scope of the following claims.

What is claimed is:

1. A device, comprising:
   a motherboard with a plurality of electrical lands arranged on a surface of the motherboard;
   an edge connector affixed to the surface of the motherboard having a plurality of conductive polymer contacts that align with the plurality of electrical lands of the motherboard; and
   a circuit module replaceably housed in the edge connector and having a plurality of edge electrical terminals that align with the plurality of conductive polymer contacts, the plurality of edge electrical terminals bearing against the plurality of conductive polymer contacts which bear against the plurality of electrical lands to form electrical connections.

2. The device of claim 1, wherein the plurality of edge electrical terminals comprise a corresponding plurality of plated grooves in an edge surface of the circuit module that align with the plurality of conductive polymer contacts when the circuit module is housed in the connector.

3. The device of claim 2, wherein the plated grooves partially surround the conductive polymer contacts when the circuit module is housed in the connector.

4. The device of claim 1, wherein the connector is affixed to the motherboard with a mechanical fastener.

5. The device of claim 1, wherein the connector is surface mounted to the motherboard using a plurality of surface mounting pads.

6. The device of claim 1, wherein the conductive polymer contacts are coupled to at least one carrier that is attached to the inner surface of the connector.

7. The device of claim 1, wherein the circuit module is a memory module.

8. The device of claim 1, wherein the motherboard is a computer motherboard.

9. The device of claim 1, wherein the electrical connector is a memory module socket connector further comprising a latch to secure the circuit module after the circuit module is joined with the electrical connector.

10. An electrical edge connector for interconnecting a circuit module to a motherboard, comprising:
    a connector housing sized to receive an edge electrical terminal along an edge of the circuit module, wherein the connector housing is operative to affix to a surface of the motherboard;
    a conductive polymer contact provided in the connector housing that contacts the edge terminal of the circuit module and an electrical land on the motherboard when the circuit module is joined with the connector housing; and
    a latch coupled to the connector housing that is operative to retain the position of the circuit module when the circuit module is joined with the connector housing.

11. The electrical edge connector of claim 10, wherein the electrical connector is a memory module socket connector.

12. The electrical edge connector of claim 10, wherein the electrical connector housing is operative to affix to the motherboard with a mechanical fastener.

13. The electrical edge connector of claim 10, wherein the electrical connector housing is operative to affix to the motherboard using a plurality of surface mounting pads.

14. The electrical edge connector of claim 10, wherein the conductive polymer contact is coupled to at least one carrier that is coupled to the inner surface of the connector housing.

15. The electrical edge connector of claim 10, wherein the latch is operative to retain the circuit module in a position such that the electrical terminal along the edge of the circuit module makes contact and compresses the conductive polymer contact against the surface of the motherboard.

16. A memory module connectable to a motherboard by an edge connector affixed to a surface of the motherboard, the memory module comprising:
    a circuit board having a memory chip, a front surface, a back surface, and an edge surface joining the front surface and back surface;
    an edge electrical terminal on the front surface of the circuit board along an edge shared by the edge surface; and
    a plated groove in the edge surface of the circuit board that is electrically conductive with the electrical terminal, wherein when the memory module is housed in the edge connector on the motherboard the groove partially surrounds and contacts a corresponding edge connector electrical contact, which contacts a corresponding electrical land on the surface of the motherboard.

17. The memory module of claim 16, further comprising a second electrical terminal on the back surface of the circuit board along an edge shared by the edge surface.

18. The memory module of claim 17, further comprising an internal layer of the circuit board that separates the front and back surfaces of the circuit board.

19. The memory module of claim 18, further comprising a second plated groove in the edge surface that corresponds to and electrically conducts with the second electrical terminal on the back surface of the circuit board.

20. The memory module of claim 19, wherein the groove corresponding to the electrical terminal on the front surface of the circuit board is separated by the internal layer from the second groove corresponding to the second electrical terminal on the back surface of the circuit board.

* * * * *